(12) United States Patent
Wu et al.

(10) Patent No.: US 12,159,782 B2
(45) Date of Patent: Dec. 3, 2024

(54) ULTRAVIOLET AND OZONE CLEAN SYSTEM

(71) Applicant: Applied Materials, Inc., Santa Clara, CA (US)

(72) Inventors: Banqiu Wu, San Jose, CA (US); Khalid Makhamreh, Los Gatos, CA (US); Hiroki Ogawa, Yokohama (JP); Eliyahu Shlomo Dagan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/370,481

(22) Filed: Sep. 20, 2023

(65) Prior Publication Data

US 2024/0014028 A1 Jan. 11, 2024

Related U.S. Application Data

(63) Continuation of application No. 17/397,088, filed on Aug. 9, 2021, now Pat. No. 11,798,799.

(51) Int. Cl.
*H01L 21/02* (2006.01)
*B08B 3/10* (2006.01)
*B08B 7/00* (2006.01)

(52) U.S. Cl.
CPC .......... *H01L 21/02052* (2013.01); *B08B 3/10* (2013.01); *B08B 7/0057* (2013.01); *B08B 2203/005* (2013.01)

(58) Field of Classification Search
CPC ......... H01L 21/02052; H01L 21/67028; H01L 21/67167; B08B 3/10; B08B 7/0057; B08B 2203/005; G03F 1/82; G03F 7/70925

(Continued)

(56) References Cited

U.S. PATENT DOCUMENTS 3,971,947 A * 7/1976 Lambert ................ A01K 63/04
D23/209
4,959,142 A * 9/1990 Dempo ..................... C02F 1/78
422/186.01

(Continued)

FOREIGN PATENT DOCUMENTS

JP 05-259139 A 10/1993
KR 10-2002-0064028 A 8/2002
WO WO 2017/170595 A1 10/2017

OTHER PUBLICATIONS

PCT International Search Report and Written Opinion for PCT/US2022/073722 dated Oct. 31, 2022.

*Primary Examiner* — David G Cormier
*Assistant Examiner* — Thomas Bucci
(74) *Attorney, Agent, or Firm* — MOSER TABOA

(57) ABSTRACT

A cleaning apparatus for cleaning a substrate includes a lamp for emitting ultraviolet radiation in an irradiation region; a housing that houses the lamp; a water deflector spaced below the housing, the water deflector having a water inlet for receiving a supply of ozonated water and a water outlet for discharging ozonated water irradiated by the lamp into a substrate processing region beneath the water deflector, and defining a water flow path between the water inlet and the water outlet, the water flow path extending in the irradiation region; an upper reflector extending along and above the lamp; and a lower reflector extending along and below the water deflector, wherein the upper reflector and the lower reflector at least partially define the irradiation region and reflect ultraviolet radiation toward the water flow path, and wherein the lower reflector shields the substrate from ultraviolet radiation emitted by the lamp.

20 Claims, 3 Drawing Sheets

(58) Field of Classification Search
USPC .......................................................... 134/105
See application file for complete search history.

(56) References Cited

U.S. PATENT DOCUMENTS

| | | | | |
|---|---|---|---|---|
| 5,200,156 | A * | 4/1993 | Wedekamp | C02F 1/325 |
| | | | | 313/493 |
| 5,302,356 | A * | 4/1994 | Shadman | C02F 1/725 |
| | | | | 422/186 |
| 5,352,327 | A | 10/1994 | Witowski | |
| 5,780,860 | A * | 7/1998 | Gadgil | A61L 2/10 |
| | | | | 250/435 |
| 7,456,113 | B2 | 11/2008 | Rayandayan et al. | |
| 10,002,771 | B1 | 6/2018 | Lianto et al. | |
| 11,798,799 | B2 * | 10/2023 | Wu | H01L 21/67028 |
| 2001/0001392 | A1 * | 5/2001 | Hirae | B08B 7/0057 |
| | | | | 257/E21.228 |
| 2003/0192570 | A1 | 10/2003 | Thakur et al. | |
| 2004/0025787 | A1 * | 2/2004 | Selbrede | C23C 16/4411 |
| | | | | 427/255.31 |
| 2004/0040496 | A1 * | 3/2004 | Ohnoda | B01J 19/123 |
| | | | | 117/200 |
| 2004/0241991 | A1 * | 12/2004 | Aoyama | H01L 21/28202 |
| | | | | 438/689 |
| 2005/0167611 | A1 * | 8/2005 | Elsegood | A61L 2/10 |
| | | | | 250/435 |
| 2005/0229946 | A1 * | 10/2005 | Hirae | H01L 21/67051 |
| | | | | 257/E21.228 |
| 2007/0181165 | A1 | 8/2007 | Verhaverbeke | |
| 2008/0047577 | A1 * | 2/2008 | Goto | H01L 21/67051 |
| | | | | 134/1 |
| 2008/0264441 | A1 | 10/2008 | Takagi | |
| 2009/0065027 | A1 * | 3/2009 | Kawamura | H01L 21/02087 |
| | | | | 134/105 |
| 2009/0117500 | A1 | 5/2009 | Gouk et al. | |
| 2010/0038833 | A1 * | 2/2010 | Kasai | H01L 21/67115 |
| | | | | 266/250 |
| 2012/0090691 | A1 * | 4/2012 | Baluja | H01L 21/6719 |
| | | | | 137/13 |
| 2012/0211024 | A1 * | 8/2012 | Dietze | B08B 7/0035 |
| | | | | 134/1 |
| 2014/0353222 | A1 * | 12/2014 | Sabin | B65D 47/06 |
| | | | | 250/431 |
| 2015/0075748 | A1 * | 3/2015 | Suzuki | H01L 21/68771 |
| | | | | 165/80.5 |
| 2015/0136186 | A1 * | 5/2015 | Brown | H01L 21/67051 |
| | | | | 134/113 |
| 2015/0203369 | A1 * | 7/2015 | Yanagawa | C02F 1/325 |
| | | | | 250/434 |
| 2015/0264790 | A1 * | 9/2015 | Miyagi | G03F 1/82 |
| | | | | 378/66 |
| 2016/0009570 | A1 * | 1/2016 | Yu | C02F 1/325 |
| | | | | 210/748.1 |
| 2016/0052802 | A1 * | 2/2016 | Ochi | C02F 1/325 |
| | | | | 250/435 |
| 2017/0166458 | A1 * | 6/2017 | Rimbault | A23L 2/50 |
| 2018/0236501 | A1 * | 8/2018 | Duda | G03F 1/82 |
| 2018/0371628 | A1 * | 12/2018 | Ide | C25B 1/30 |
| 2020/0009621 | A1 * | 1/2020 | Han | H01L 21/67051 |
| 2021/0013064 | A1 * | 1/2021 | Yoon | H01L 21/6719 |
| 2021/0197224 | A1 * | 7/2021 | Abe | H01L 21/02628 |
| 2022/0277970 | A1 * | 9/2022 | Su | H01L 31/206 |

\* cited by examiner ated water and a water outlet for discharging ozonated water irradiated by the lamp into a substrate processing region beneath the water deflector, and defining a water flow path between the water inlet and the water outlet, the water flow path extending in the irradiation region; an upper reflector within the cooling chamber of the housing extending along and above the lamp; a lower reflector extending along and below the water deflector, wherein the upper reflector and the lower reflector are configured to at least partially define the irradiation region and to reflect ultraviolet radiation emitted by the lamp toward the water flow path, and wherein the lower reflector is configured to shield the substrate from ultraviolet radiation emitted by the lamp; and a substrate support for supporting the substrate below the lower reflector in the substrate processing region, the substrate support configured to rotate the substrate, wherein the cleaning apparatus is configured to translate horizontally while flowing irradiated ozonated water into the substrate processing region.

ULTRAVIOLET AND OZONE CLEAN SYSTEM

CROSS-REFERENCE TO RELATED APPLICATIONS

This application is a continuation of and claims the benefit of U.S. patent application Ser. No. 17/397,088, filed Aug. 9, 2021, which is herein incorporated by reference in its entirety.

FIELD

Embodiments of the present disclosure generally relate to a cleaning system, and, more specifically, to an ultraviolet and ozone cleaning system.

BACKGROUND

Substrates for use in the semiconductor manufacturing industry are often cleaned to remove unwanted materials such as contaminants or other unwanted particles generated thereon during processing. Substrates may include semiconductor wafers, chamber components, photomasks, or the like.

Contaminants can be removed by washing the substrate with ultraviolet-irradiated ozonated water. Such water can be irradiated by an ultraviolet radiation source that emits ultraviolet radiation. However, the inventors have observed that some ultraviolet ozonated water cleaning devices and methods expose the substrate to the emitted ultraviolet radiation, which can, by itself, undesirably contribute to removing or altering additional materials besides the contaminants to be cleaned. The additional material removal or alteration may cause defects to the substrate.

Accordingly, the inventors have provided improved cleaning apparatuses and methods for cleaning substrates.

SUMMARY

Embodiments of apparatuses and methods for cleaning a substrate are provided herein. In some embodiments, an apparatus for cleaning a substrate includes a lamp configured to emit ultraviolet radiation in an irradiation region; a housing that houses the lamp, the housing defining a cooling chamber surrounding the lamp; a water deflector spaced below the housing, the water deflector having a water inlet for receiving a supply of ozonated water and a water outlet for discharging ozonated water irradiated by the lamp into a substrate processing region beneath the water deflector, and defining a water flow path between the water inlet and the water outlet, the water flow path extending in the irradiation region; an upper reflector within the cooling chamber of the housing extending along and above the lamp; and a lower reflector extending along and below the water deflector, wherein the upper reflector and the lower reflector are configured to at least partially define the irradiation region and to reflect ultraviolet radiation emitted by the lamp toward the water flow path, and wherein the lower reflector is configured to shield the substrate from ultraviolet radiation emitted by the lamp.

In some embodiments, an apparatus for cleaning a substrate includes a lamp configured to emit ultraviolet radiation in an irradiation region; a housing that houses the lamp, the housing defining a cooling chamber surrounding the lamp; a water deflector spaced below the housing, the water deflector having a water inlet for receiving a supply of In some embodiments, a method for cleaning a substrate includes flowing ultraviolet-irradiated ozonated water onto the substrate while shielding the substrate from ultraviolet radiation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
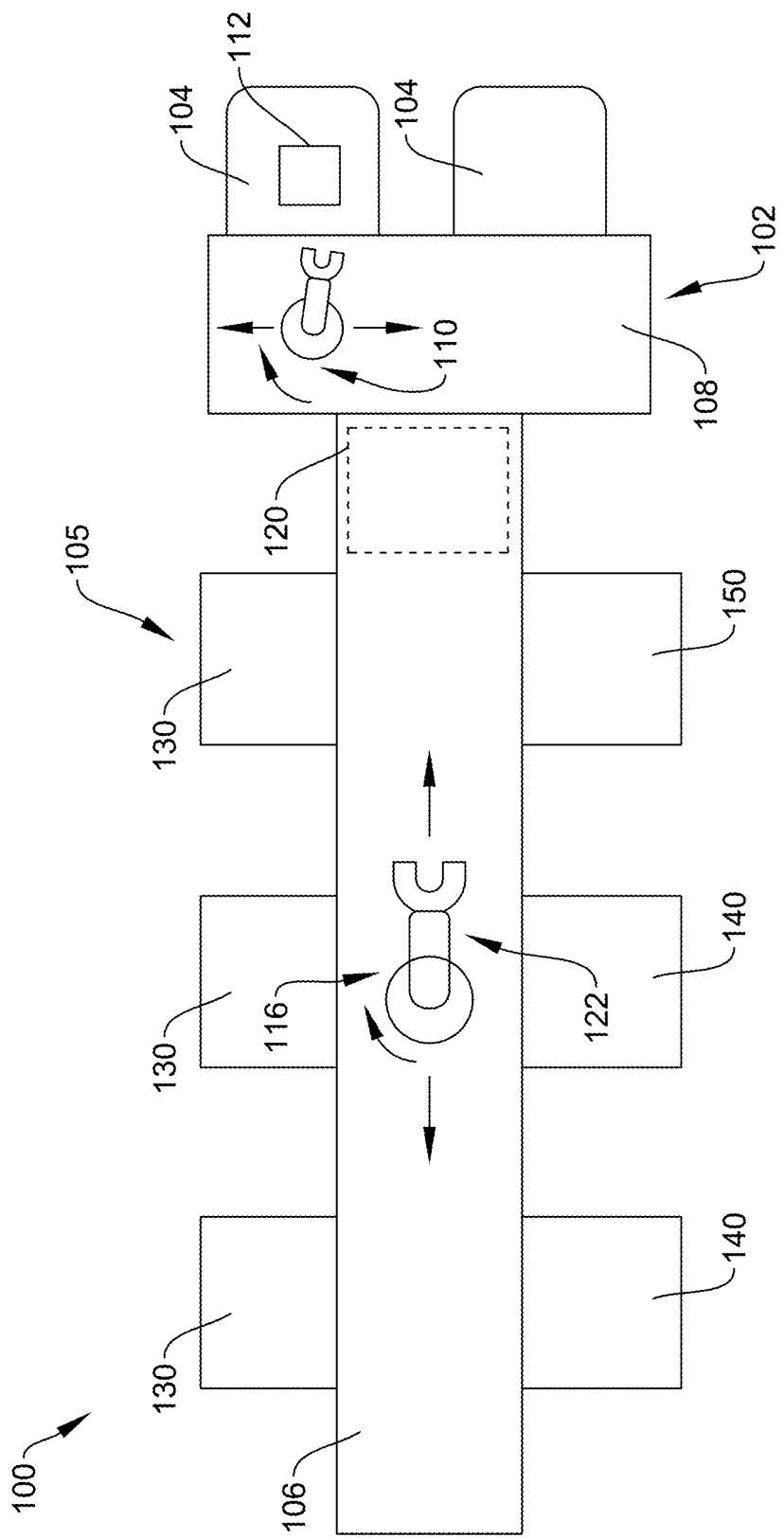
FIG. 1 depicts a schematic view of a multi-chamber processing tool having a cleaning chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of cleaning chambers for cleaning substrates are provided herein. The cleaning chambers are configured to clean the substrates to remove unwanted particles or residue after the substrates undergo a wet clean or a dry clean process. The substrates may be, for example, semiconductor wafers, photomasks, or the like. In the example of the photomasks, photoresist may be left on the substrate. Flowing ultraviolet-irradiated ozonated water over the photoresist causes the photoresist to dissociate from the photomask. The dissociated residue and water may then be removed from an interior volume of the cleaning chamber.

FIG. 1 depicts a schematic view of a multi-chamber processing tool (tool) 100 having one or more wet cleaning chambers 130 (three shown in FIG. 1) in accordance with at least some embodiments of the present disclosure. The below-described tool 100 is shown in an exemplary configuration and other configurations can be utilized as well. The tool 100 generally includes a factory interface 102, a transfer chamber 106 coupled to the factory interface 102, and a plurality of process chambers 105, including the wet cleaning chambers 130 coupled to the transfer chamber 106. The factory interface 102 includes a plurality of loadports 104 for receiving one or more substrates 112. The one or more substrates 112 may be semiconductor wafers, carrier substrates, photomasks, or the like. In some embodiments, the plurality of loadports 104 are arranged along a common side of the factory interface 102. A factory interface robot 110 may be disposed in an interior volume 108 of the factory interface 102 to shuttle or transport the one or more substrates 112 from the plurality of loadports 104 to the transfer chamber 106. The factory interface robot 110 may be configured for rotational movement within the interior volume 108, lateral movement within the interior volume 108, or both.

The transfer chamber 106 is coupled to the factory interface 102, and in some embodiments, is disposed on a side of the factory interface 102 opposite the plurality of loadports 104. The transfer chamber 106 includes a transfer robot 116 disposed therein for shuttling the one or more substrates 112 received from the factory interface robot 110 to the one or more process chambers 105 coupled to the transfer chamber. The transfer robot 116 may be configured for rotational movement, lateral movement, or both. For example, lateral movement may be achieved via rails on a floor of the transfer chamber 106 or via wheels or tracks under the transfer robot 116. An arm 122 of the transfer robot 116 may expand and contract to move the one or more substrates 112 into and out of respective chambers of the plurality of process chambers 105.

In some embodiments, the transfer robot 116 is configured to directly receive the one or more substrates 112 from the factory interface robot 110. In some embodiments, the transfer robot 116 is configured to indirectly receive the one or more substrates 112 from the factory interface robot 110. For example, in some embodiments, one of the factory interface 102 or the transfer chamber 106 includes a buffer 120 configured to hold one or more of the one or more substrates 112. The transfer robot 116 may be configured to transfer the one or more substrates 112 to the buffer 120 and the transfer robot 116 may be configured to transfer the one or more substrates 112 from the buffer 120 to the plurality of process chambers 105 and from the plurality of process chambers 105 back to the buffer 120.

The transfer chamber 106 may have one or more environmental controls. For example, an airflow opening in the transfer chamber 106 may include a filter to filter the airflow entering the transfer chamber 106. Other environmental controls may include one or more of humidity control, static control, temperature control, or pressure control.

The one or more process chambers 105 may be coupled orthogonally to the transfer chamber 106 or may be coupled at an angle with respect to the transfer chamber 106. The plurality of process chambers 105 may be sealingly engaged with the transfer chamber 106. The transfer chamber 106 generally operates at atmospheric pressure but may be configured to operate at vacuum pressure. The plurality of process chambers 105 are configured to perform one or more processing steps to one or more substrates 112 being processed in the tool 100. For example, the plurality of process chambers 105 may comprise one or more wet clean chambers 130 (three shown in FIG. 1) configured to clean the one or more substrates 112 with a liquid, for example, water. The plurality of process chambers 105 may comprise one or more dry clean chambers 140 (two shown in FIG. 1) configured to perform a dry clean process on the one or more substrates 112, for example, via a plasma etch or plasma ashing procedure. The one or more process chambers 105 includes at least one baking chamber, for example, the baking chamber 150 configured to heat the one or more substrates to remove residue or haze left over after the wet clean or dry clean process. In some embodiments, the one or more wet clean chambers 130 are disposed on a side of the transfer chamber 106 different than the one or more dry clean chambers 140.

Figure 2:
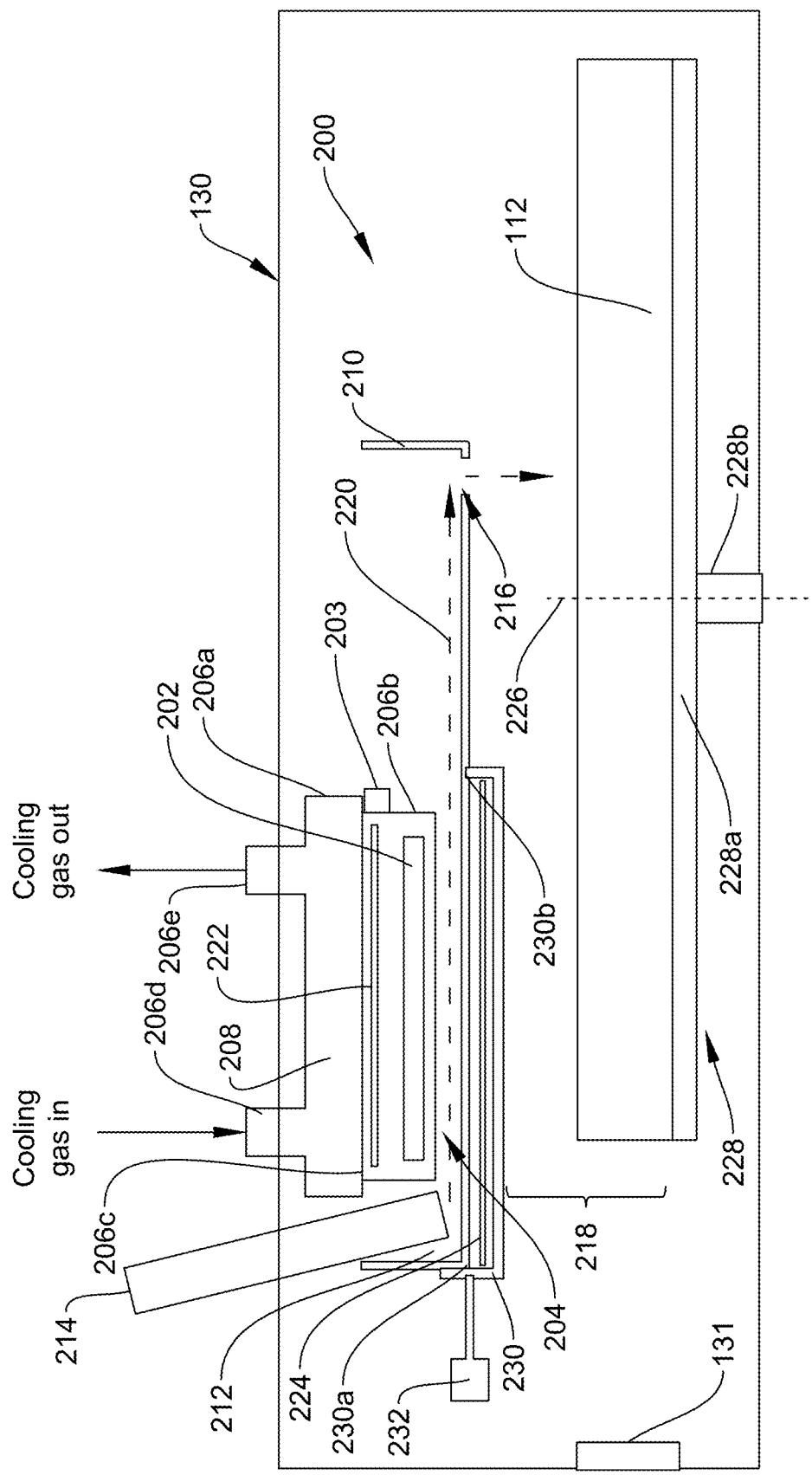
FIG. 2 depicts a schematic view of a cleaning apparatus in a cleaning chamber of the multi-chamber processing tool depicted in FIG. 1.

FIG. 2 is a schematic view of a cleaning apparatus 200 housed in a wet cleaning chamber 130 of the multi-chamber processing tool 100 of FIG. 1. In some embodiments, the wet cleaning chamber 130 may form part of the cleaning apparatus 200. In FIG. 2, the cleaning apparatus 200 is shown being used to clean the substrate 112. Although described in connection with a particular wet cleaning chamber 130 in the multi-chamber processing tool 100 shown above, the cleaning apparatus 200 may be housed in wet-cleaning chambers having other configurations than can be in processing tools having other configurations, including use as a standalone tool without coupling to a multi-chamber processing tool.

The cleaning apparatus 200 includes a lamp 202 configured to emit ultraviolet radiation in an irradiation region 204 above and below the lamp 202. The lamp 202 may be a low-pressure mercury ultraviolet lamp. The lamp 202 may operate at about 80 to 90 watts and emit ultraviolet radiation having a spectrum defined by a peak amplitude at a wavelength of about 254 nanometers.

The cleaning apparatus 200 also includes a housing 206 that houses the lamp 202. The housing 206 defines a cooling chamber 208 surrounding the lamp 202. In the embodiment shown in FIG. 2, the housing 206 may include an upper cover 206a and a lower cover 206b sealingly engaged together, such as, for example, with an o-ring 206c. The upper cover 206a may be formed from polytetrafluoroethylene (PTFE) and the lower cover 206b may be formed from quartz that permits the transmission of ultraviolet radiation emitted by the lamp 202. The housing 206 may have an inlet 206d and an outlet 206e. The inlet 206d and the outlet 206e may be formed in the upper cover 206a as shown in the embodiment of FIG. 2. The inlet 206d may be fluidly coupled to a supply of cooling fluid, such as cool dry air. The outlet 206e may be fluidly coupled to a cooling fluid exhaust. The inlet 206d and the outlet 206e are in fluid communication with the cooling chamber 208, which is configured to route the cooling fluid between the inlet 206d and the outlet 206e and over the lamp 202. The flow of cooling fluid over the lamp 202 cools the lamp 202 to control the temperature of the lamp 202.

The temperature of the lamp 202 can affect the peak amplitude of the emission spectrum emitted by the lamp 202. For example, a lower temperature may decrease the peak amplitude. In embodiments, the cleaning apparatus 200 may include an ultraviolet monitor 203 to monitor the peak amplitude of the emission spectrum of the lamp 202, which can be used as feedback to regulate the temperature of the lamp 202, i.e., by adjusting the parameters of the cooling fluid passing through the cooling chamber 208, such as cooling fluid flow rate and inlet temperature of the cooling fluid. The ultraviolet monitor 203 may be connected to the housing 206 as shown in FIG. 2.

The cleaning apparatus 200 also includes a water deflector 210 spaced below the housing 206. The water deflector 210 has a water inlet 212 for receiving a supply of ozonated water 214 and a water outlet 216 for discharging ozonated water irradiated by the lamp 202 into a substrate processing region 218 beneath the water deflector 210. The water deflector 210 defines a water flow path 220 between the water inlet 212 and the water outlet 216. The water flow path 220 extends in the irradiation region 204 so that the ozonated water may be irradiated by the ultraviolet radiation emitted by the lamp 202 as the ozonated water passes through the irradiation region 204 towards the water outlet 216. The water deflector 210 may be formed from quartz and may permit the transmission of ultraviolet radiation emitted by the lamp 202.

Also, the cleaning apparatus 200 includes an upper reflector 222, which may be disposed within the cooling chamber 208 of the housing 206, as shown in FIG. 2. The upper reflector 222 extends along and above the lamp 202. The cleaning apparatus 200 also includes a lower reflector 224 extending along and below the lamp 202 and below the water deflector 210. The upper reflector 222 and the lower reflector 224 are configured to at least partially define the irradiation region 204 and to reflect ultraviolet radiation emitted by the lamp 202 toward the water flow path 220. The lower reflector 224 is configured to shield the substrate processing region 218 (as well as the substrate 112 in the substrate processing region 218) from ultraviolet radiation emitted by the lamp 202. The upper reflector 222 and the lower reflector 224 may be formed of aluminum or an aluminum alloy or any other suitable material that can reflect ultraviolet radiation and provide shielding to the substrate processing region 218.

The cleaning apparatus 200 may also include a substrate support 228 located in the substrate processing region 218. The substrate support 228 has a plate 228a and a shaft 228b extending from the plate 228a to the wet cleaning chamber 130. The substrate support 228 is rotatably connected to the wet cleaning chamber 130. The substrate support 228 is configured to rotate about a central axis 226 extending vertically through the shaft 228b. As shown in FIG. 2, the plate 228a is configured to support a substrate 112 in the substrate processing region 218 while ultraviolet-irradiated ozonated water flows onto the substrate 112.

The water deflector 210 may extend horizontally from the housing 206 to laterally space the water outlet 216 from the housing 206. The water deflector 210 may extend horizontally from the housing 206 a distance between 0.5 inch to 4 inches. Also, the water outlet 216 may be spaced vertically about 2.5 inches from an upper surface of the substrate 112.

The cleaning apparatus 200 may include a reflector protector 230, which may support at least one of the water deflector 210 and the lower reflector 224. The reflector protector 230 may have a first end 230a and a second end 230b bonded to the water deflector 210. The reflector protector 230 may be connected to the wet cleaning chamber 130 via an actuator 232 (e.g., a linear actuator) configured to translate the water deflector 210 and the water outlet 216 within the wet cleaning chamber 130 relative to the substrate support 228. In embodiments, the water deflector 210 may be configured to translate while the substrate support 228 rotates about central axis 226. Translating the water deflector 210 relative to the substrate support 228 can translate the horizontal position of the water outlet 216 of the water deflector 210 over the substrate processing region 218. Thus, the ultraviolet-irradiated ozonated water can advantageously be directed to different locations on the substrate 112 to be cleaned when the substrate 112 is supported by the substrate support 228 in the substrate processing region 218, providing more controlled (e.g., more uniform) cleaning process results.

The wet cleaning chamber 130 may have a slit valve door 131 that is operable to open and close to permit the substrate 112 to be introduced or removed from the interior of the wet cleaning chamber 130, such as by transfer robot 116 (FIG. 1).

Figure 3:
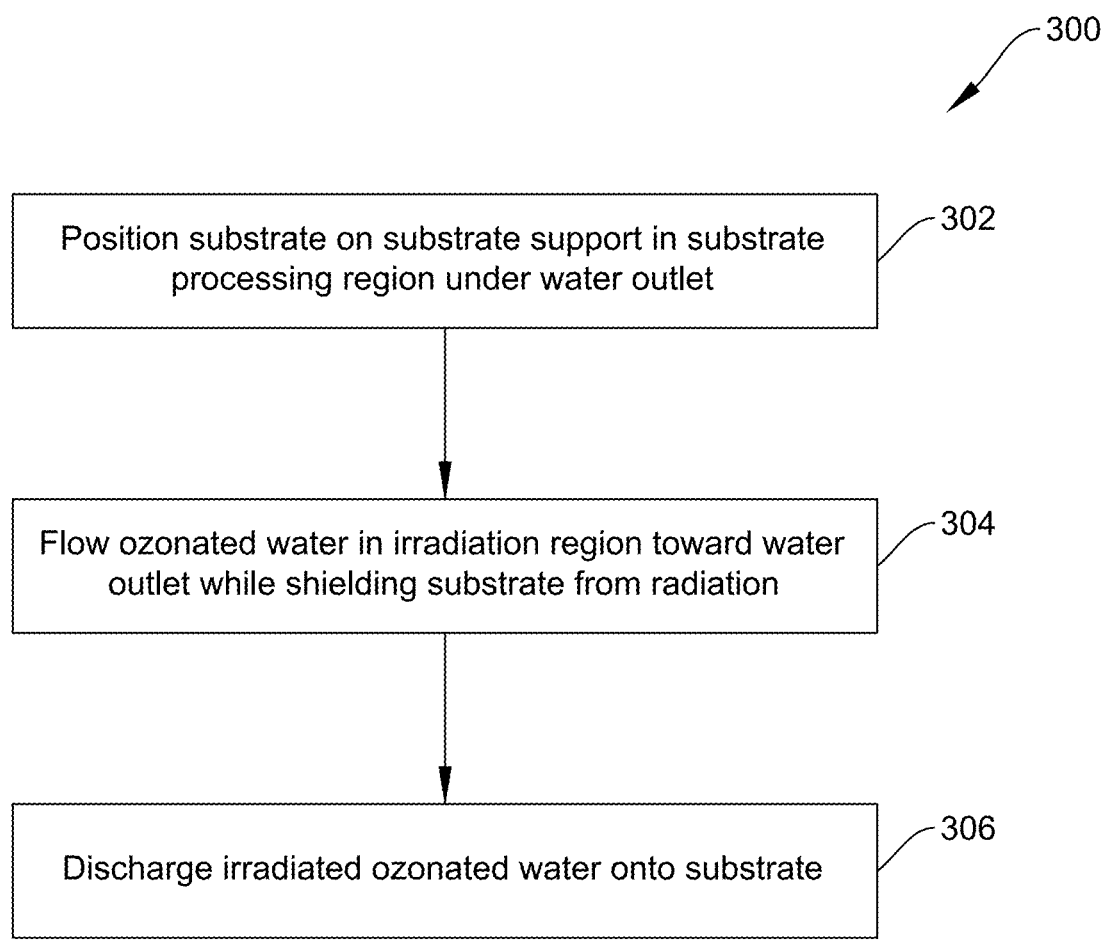
FIG. 3 depicts a cleaning workflow employing the cleaning apparatus depicted in FIG. 2 in accordance with at least some embodiments of the present disclosure.

FIG. 3 depicts a cleaning workflow 300 in accordance with at least some embodiments of the present disclosure. At 302, the substrate 112 is placed on the plate 228a of the substrate support 228. The substrate 112 is positioned in the substrate processing region 218 and is located vertically under the water outlet 216. At 304 the ozonated water from the supply of ozonated water 214 flows along the water flow path 220 through the irradiation region 204. At 306 ultraviolet-irradiated ozonated water is discharged from the water outlet 216 and falls by gravity on the substrate 112. During the cleaning workflow 300, the shaft 228b of the substrate support 228 may be rotated about the central axis 226 to rotate the substrate 112 relative to the water deflector 210. Also, during the cleaning workflow 300, the water deflector 210 may be translated horizontally. The rotation of the shaft 228b may be in tandem with, or independent of, the translation of the water deflector 210. The ultraviolet-irradiated ozonated water may be provided over the surface of the substrate 112 for a predetermined time or the process may be monitored to determine an end to the cleaning process, at which time the ultraviolet lamp 202 can be powered down and the flow of ozonated water ceased. The cleaned substrate 112 can then be removed from the chamber 130 and, if desired, a new substrate 112 can be introduced to perform the cleaning process again.

While the foregoing is directed to embodiments of the present disclosure, other and further embodiments of the disclosure may be devised without departing from the basic scope thereof.

The invention claimed is:

1. A cleaning apparatus for cleaning a substrate, comprising:
    a lamp configured to emit ultraviolet radiation in an irradiation region;
    a water deflector spaced below the lamp, the water deflector having a water inlet for receiving a supply of ozonated water and a water outlet for discharging ozonated water irradiated by the lamp into a substrate processing region beneath the water deflector, and defining a water flow path between the water inlet and the water outlet, the water flow path extending in the irradiation region, wherein the water outlet is offset from the irradiation region; and
    a substrate support for supporting the substrate below the water outlet in the substrate processing region.

2. The cleaning apparatus of claim 1, further comprising an upper reflector extending along and above the lamp, wherein the upper reflector is configured to at least partially define the irradiation region and to reflect ultraviolet radiation emitted by the lamp toward the water flow path.

3. The cleaning apparatus of claim 2, wherein the upper reflector has a length that is equal or greater than a length of the lamp.

4. The cleaning apparatus of claim 1, further comprising a lower reflector extending along and below the water deflector, wherein the lower reflector is configured to at least partially define the irradiation region and to reflect ultraviolet radiation emitted by the lamp toward the water flow path, and wherein the lower reflector is configured to shield the substrate from ultraviolet radiation emitted by the lamp.

5. The cleaning apparatus of claim 4, wherein the lower reflector has a length that is equal or greater than a length of the lamp.

6. The cleaning apparatus of claim 4, further comprising a substrate support for supporting the substrate below the water outlet in the substrate processing region, wherein the lower reflector is disposed between the water outlet and the substrate support.

7. The cleaning apparatus of claim 1, wherein the lamp operates between 80 to 90 watts.

8. The cleaning apparatus of claim 1, wherein the substrate support is configured to rotate the substrate.

9. The cleaning apparatus of claim 1, further comprising a housing that houses the lamp, the housing defining a cooling chamber surrounding the lamp, wherein the housing has an inlet and an outlet in fluid communication with the cooling chamber, the cooling chamber configured to route a cooling fluid between the inlet of the housing and the outlet of the housing and over the lamp.

10. The cleaning apparatus of claim 9, wherein the cooling fluid comprises cool dry air.

11. The cleaning apparatus of claim 9, wherein the housing includes an upper cover and a lower cover sealed to the upper cover, wherein the inlet of the housing and the outlet of the housing are formed in the upper cover.

12. The cleaning apparatus of claim 11, wherein the upper cover is formed from PTFE and the lower cover is formed from quartz.

13. The cleaning apparatus of claim 9, wherein a horizontal spacing between the water outlet and the housing is 0.5 inch to 4 inches.

14. The cleaning apparatus of claim 13, wherein the horizontal spacing is between 1 inch and 2 inches.

15. The cleaning apparatus of claim 1, wherein the water outlet is configured to translate horizontally relative to the substrate processing region.

16. A method for cleaning a substrate, comprising:
emitting ultraviolet radiation from a lamp in an irradiation region;
receiving, at an inlet of a water deflector spaced below the lamp, a supply of ozonated water; and
discharging, at an outlet of the water deflector, ultraviolet-irradiated ozonated water irradiated by the lamp into a substrate processing region beneath the water deflector, the water deflector defining a water flow path between the inlet and the outlet, the water flow path extending in the irradiation region, wherein the outlet is offset from the irradiation region.

17. The method of claim 16, further comprising horizontally translating the outlet with respect to the substrate processing region while discharging the ultraviolet-irradiated ozonated water.

18. The method of claim 16, further comprising discharging the ultraviolet-irradiated ozonated water onto a substrate in the substrate processing region.

19. The method of claim 18, further comprising rotating the substrate while discharging the ultraviolet-irradiated ozonated water onto the substrate.

20. The method of claim 18, further comprising shielding the substrate from ultraviolet radiation while discharging the ultraviolet-irradiated ozonated water onto the substrate.

* * * * *